United States Patent
Moschiano et al.

(10) Patent No.: US 8,593,876 B2
(45) Date of Patent: Nov. 26, 2013

(54) SENSING SCHEME IN A MEMORY DEVICE

(75) Inventors: Violante Moschiano, Bacoli (IT);
  Giovanni Santin, Rieti (IT); Tommaso Vali, Sezze (IT)

(73) Assignee: Micron Technology, Inc., Boise, ID (US)

( * ) Notice: Subject to any disclaimer, the term of this patent is extended or adjusted under 35 U.S.C. 154(b) by 205 days.

(21) Appl. No.: 13/085,611

(22) Filed: Apr. 13, 2011

(65) Prior Publication Data
  US 2012/0262993 A1   Oct. 18, 2012

(51) Int. Cl.
  *G11C 11/34* (2006.01)
  *G11C 7/00* (2006.01)

(52) U.S. Cl.
  USPC .................................... 365/185.21; 365/205

(58) Field of Classification Search
  USPC .............................. 365/185.21, 196, 207, 205
  See application file for complete search history.

(56) References Cited

U.S. PATENT DOCUMENTS

| | | |
|---|---|---|
| 5,524,094 A * | 6/1996 | Nobukata et al. ........ 365/185.21 |
| 5,623,444 A | 4/1997 | Gotou et al. |
| 6,687,161 B2 | 2/2004 | Marotta et al. |
| 7,317,628 B1 | 1/2008 | Meng |
| 7,324,381 B2 | 1/2008 | Gallo et al. |
| 7,701,763 B2 | 4/2010 | Roohparvar |
| 2008/0013381 A1 | 1/2008 | Giambartino et al. |
| 2009/0244978 A1 * | 10/2009 | Yoshihara et al. ........ 365/185.21 |

* cited by examiner

*Primary Examiner* — Van Nguyen
*Assistant Examiner* — Khamdan Alrobaie
(74) *Attorney, Agent, or Firm* — Leffert Jay & Polglaze, P.A.

(57) ABSTRACT

Methods of operating memory devices, generating reference currents in memory devices, and sensing data states of memory cells in a memory device are disclosed. One such method includes generating reference currents utilized in sense amplifier circuitry to manage leakage currents while performing a sense operation within a memory device. Another such method activates one of two serially coupled transistors along with activating and deactivating the second transistor serially coupled with the first transistor thereby regulating a current through both serially coupled transistors and establishing a particular reference current.

35 Claims, 8 Drawing Sheets

SENSING SCHEME IN A MEMORY DEVICE

TECHNICAL FIELD

The present disclosure relates generally to semiconductor memory and more particularly, in one or more embodiments, to sensing schemes in non-volatile memory devices.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming (which is sometimes referred to as writing) of charge storage structures (e.g., floating gates or charge traps) or other physical phenomena (e.g., phase change or polarization), determine the data value of each cell. Common uses for flash memory include personal computers, personal digital assistants (PDAs), digital cameras, digital media players, cellular telephones, and removable memory modules.

Flash memory typically utilizes one of two basic architectures known as NOR Flash and NAND Flash. The designation is derived from the logic used to read the devices. Typically, an array of memory cells for NAND flash memory devices is arranged such that memory cells of a string are connected together in series, source to drain.

To meet demands for higher capacity memories, designers continue to strive for increasing memory density, i.e., the number of memory cells for a given area of an integrated circuit die. Typical flash memory devices utilize circuitry to sense the data state of memory cells. These sense circuits (e.g., sense amplifiers) typically include a reference current generator to provide a particular reference current in each of the sense amplifiers of the memory device. In order to provide a precise and low level reference current, what are often referred to as long body transistors, such as long body MOSFET transistors, are utilized in each of the reference current generators of each sense amplifier of the memory device. The number of sense amplifiers in a memory device is typically quite high. For example, a memory device might comprise 64,000 sense amplifiers configured to operate in parallel. Thus, a low level reference current is also desirable due to the parallel operation of the sense amplifiers in order to maintain a low overall current consumption of the sense amplifier circuitry. A large amount of area (e.g., real estate) of the memory device may also be consumed by the long body transistors used in each of the 64,000 sense amplifiers of the memory device. The long body transistors of the sense amplifiers might consume ⅓ of the total area of the sense amplifier circuitry of the memory device, for example.

For the reasons stated above, and for other reasons which will become apparent to those skilled in the art upon reading and understanding the present specification, there is a need in the art for a reduction in the area occupied by support circuitry of memory devices, such as memory device sense amplifier circuitry.

DETAILED DESCRIPTION

In the following detailed description of the present embodiments, reference is made to the accompanying drawings that form a part hereof, and in which is shown by way of illustration specific embodiments in which the embodiments may be practiced. These embodiments are described in sufficient detail to enable those skilled in the art to practice the invention, and it is to be understood that other embodiments may be utilized and that process, electrical or mechanical changes may be made without departing from the scope of the present disclosure. The following detailed description is, therefore, not to be taken in a limiting sense.

Figure 1:
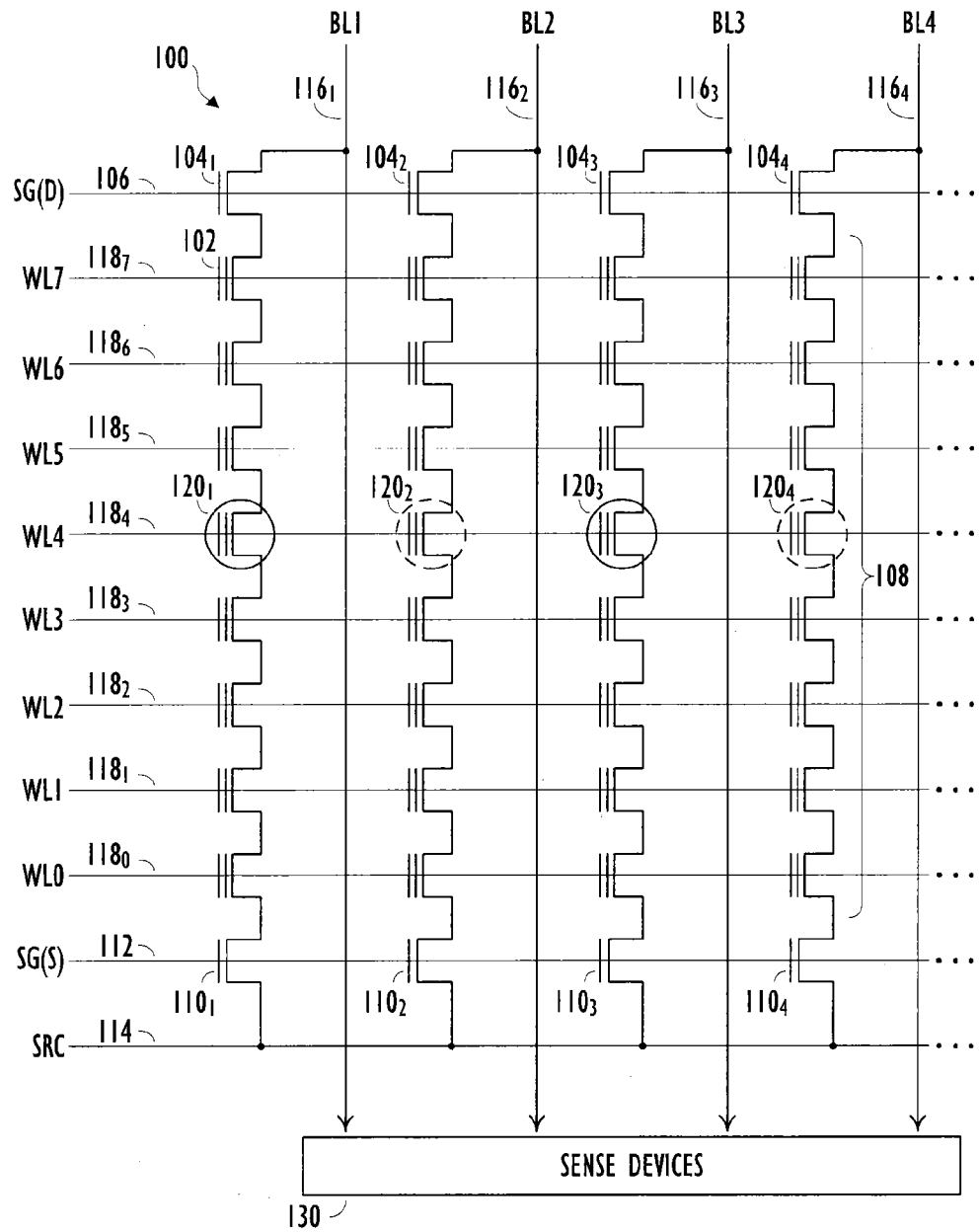
FIG. 1 shows a typical prior art arrangement of multiple series strings of memory cells of a memory array organized in a NAND architecture.

FIG. 1 illustrates a typical NAND type flash memory array architecture 100 wherein the floating gate memory cells 102 of the memory array are logically arranged in an array of rows and columns. In a conventional NAND Flash architecture, "rows" refers to memory cells having commonly coupled control gates, while "columns" refers to memory cells coupled as one or more NAND strings of memory cells 102, for example. The memory cells 102 of the array are arranged together in strings (e.g., NAND strings), typically of 8, 16, 32, or more each. Memory cells of a string are connected together in series, source to drain, between a source line 114 and a data line 116, often referred to as a bit line. Each series string of memory cells is coupled to source line 114 by a source select gate such as select gates 110 and to an individual bit line 116 by drain select gates 104, for example. The source select gates 110 are controlled by a source select gate (SGS) control line 112 coupled to their control gates. The drain select gates 104 are controlled by a drain select gate (SGD) control line 106. The one or more strings of memory cells are also typically arranged in groups (e.g., blocks) of memory cells.

The memory array 100 is accessed by a string driver (not shown) configured to activate a logical row of memory cells by selecting a particular access line 118, often referred to as a word line, such as WL7-WL0 $118_{7\text{-}0}$, for example. Each word line 118 is coupled to the control gates of a row of memory cells 120. Bit lines BL1-BL4 $116_1$-$116_4$ can be driven high or low depending on the type of operation being performed on the array. Bit lines BL1-BL4 116 are coupled to sense devices (e.g., sense amplifiers) 130 that detect the state of each cell by sensing voltage or current on a particular bit line 116. As is known to those skilled in the art, the number of word lines and bit lines might be much greater than those shown in FIG. 1.

Memory cells 102 may be configured as what are known in the art as Single Level Memory Cells (SLC) or Multilevel Memory Cells (MLC). Multilevel memory cells assign a data state (e.g., as represented by a bit pattern) to a specific range of threshold voltages (Vt) stored on the memory cell. Single level memory cells permit the storage of a single binary digit (e.g., bit) of data on each memory cell. Meanwhile, MLC technology permits the storage of two or more binary digits per cell (e.g., 2, 4, 8, 16 bits), depending on the quantity of threshold voltage ranges assigned to the cell and the stability of the assigned threshold voltage ranges during the lifetime operation of the memory cell. The number of threshold voltage ranges, which are sometimes referred to as Vt distribution windows, used to represent a bit pattern comprised of N-bits is $2^N$. For example, one bit may be represented by two ranges, two bits by four ranges, three bits by eight ranges, etc. MLC memory cells may store even or odd numbers of bits on each memory cell, and schemes providing for fractional bits are also known. A common naming convention is to refer to SLC memory as MLC (two level) memory as SLC memory utilizes two data states in order to store one bit of data, such as represented by a 0 or a 1, for example. MLC memory configured to store two bits of data can be represented by MLC (four level), three bits of data by MLC (eight level), etc.

Figure 2:
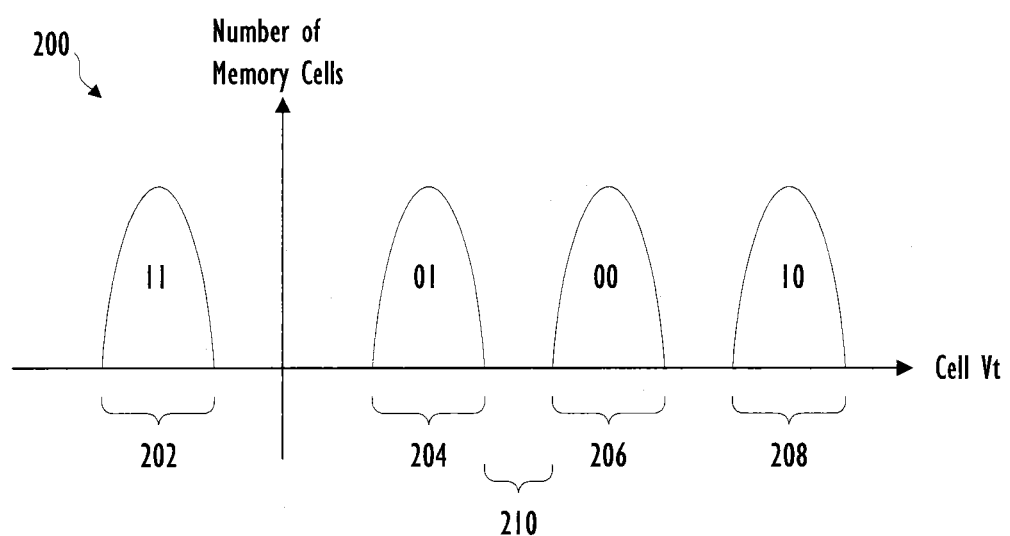
FIG. 2 shows a graphical prior art representation of a plurality of threshold voltage ranges for a population of memory cells.

FIG. 2 illustrates an example of Vt ranges 200 for a MLC (four level) (e.g., 2-bit) memory cell. For example, a memory cell might be programmed to a Vt that falls within one of four different Vt ranges 202-208 of 200 mV, each being used to represent a data state corresponding to a bit pattern comprised of two bits. Typically, a dead space 210 (e.g., sometimes referred to as a margin and may have a range of 200 mV to 400 mV) is maintained between each range 202-208 to keep the ranges from overlapping. As an example, if the Vt of a memory cell is within the first of the four Vt ranges 202, the cell in this case is storing a logical '11' state and is typically considered the erased state of the cell. If the Vt is within the second of the four Vt ranges 204, the cell in this case is storing a logical '10' state. A Vt in the third Vt range 206 of the four Vt ranges would indicate that the cell in this case is storing a logical '00' state. Finally, a Vt residing in the fourth Vt range 208 indicates that a logical '01' state is stored in the cell.

Memory cells are typically programmed using erase and programming cycles. For example, memory cells of a particular block of memory cells are first erased and then selectively programmed. For a NAND array, a block of memory cells is typically erased by grounding all of the word lines in the block and applying an erase voltage to a semiconductor substrate on which the block of memory cells are formed, and thus to the channels of the memory cells, in order to remove charges which might be stored on the charge storage structures (e.g., floating gates or charge traps) of the block of memory cells. This typically results in the Vt of memory cells residing in the Vt range 202 (e.g., erased state) of FIG. 2, for example.

Referring again to FIG. 1, programming typically involves applying one or more programming pulses (Vpgm) to a selected word line, such as WL4 $118_4$, and thus to the control gate of each memory cell 120 coupled to the selected word line. Typical programming pulses (Vpgm) start at or near 15V and tend to increase in magnitude during each programming pulse application. While the program voltage (e.g., programming pulse) is applied to the selected word line, a potential, such as a ground potential, is applied to the substrate, and thus to the channels of these memory cells, resulting in a charge transfer from the channel to the floating gates of memory cells targeted (e.g., selected) for programming. More specifically, the floating gates are typically charged through direct injection or Fowler-Nordheim tunneling of electrons from the channel to the floating gate, resulting in a Vt typically greater than zero in a programmed state, for example. In the example of FIG. 1, a Vpass voltage is applied to each unselected word line $118_{7-5}$ and $118_{3-0}$. Vpass might be 10V, for example. The Vpass applied to each unselected word line might comprise different voltages. A word line adjacent to the selected word line might be biased to a Vpass potential of 8V and the next adjacent word line might be biased to 7V, for example. The Vpass voltages are not high enough to cause programming of memory cells biased with a Vpass voltage.

An inhibit voltage is typically applied to bit lines (e.g., Vcc) which are not coupled to a NAND string containing a memory cell that is targeted for programming. During a programming operation alternate bit lines may be enabled and inhibited from programming. For example, even numbered bit lines might be enabled for programming memory cells coupled to even numbered bit lines while the odd numbered bit lines are inhibited from programming memory cells coupled to the odd numbered bit lines. A subsequent programming operation might then inhibit the even numbered bit lines and enable the odd numbered bit lines. For example, the memory cells of row 120 having solid line circles are selected for programming whereas the memory cells having dashed line circles are inhibited from programming as shown in FIG. 1.

Between the application of one or more programming (e.g., Vpgm) pulses, a sense operation (e.g., program verify operation) is performed to check each selected memory cell to determine if it has reached its intended programmed state. If a selected memory cell has reached its intended programmed state it is inhibited from further programming by selective biasing of the bit line coupled to the programmed memory cell. Following a program verify operation, an additional programming pulse Vpgm is applied if there are memory cells that have not completed programming. This process of applying one or more programming pulses followed by performing a program verify operation continues until all the selected memory cells have reached their intended programmed states. If a particular number of programming pulses (e.g., maximum number) have been applied and one or more selected memory cells still have not completed programming, those memory cells might be marked as defective, for example.

Figure 3:
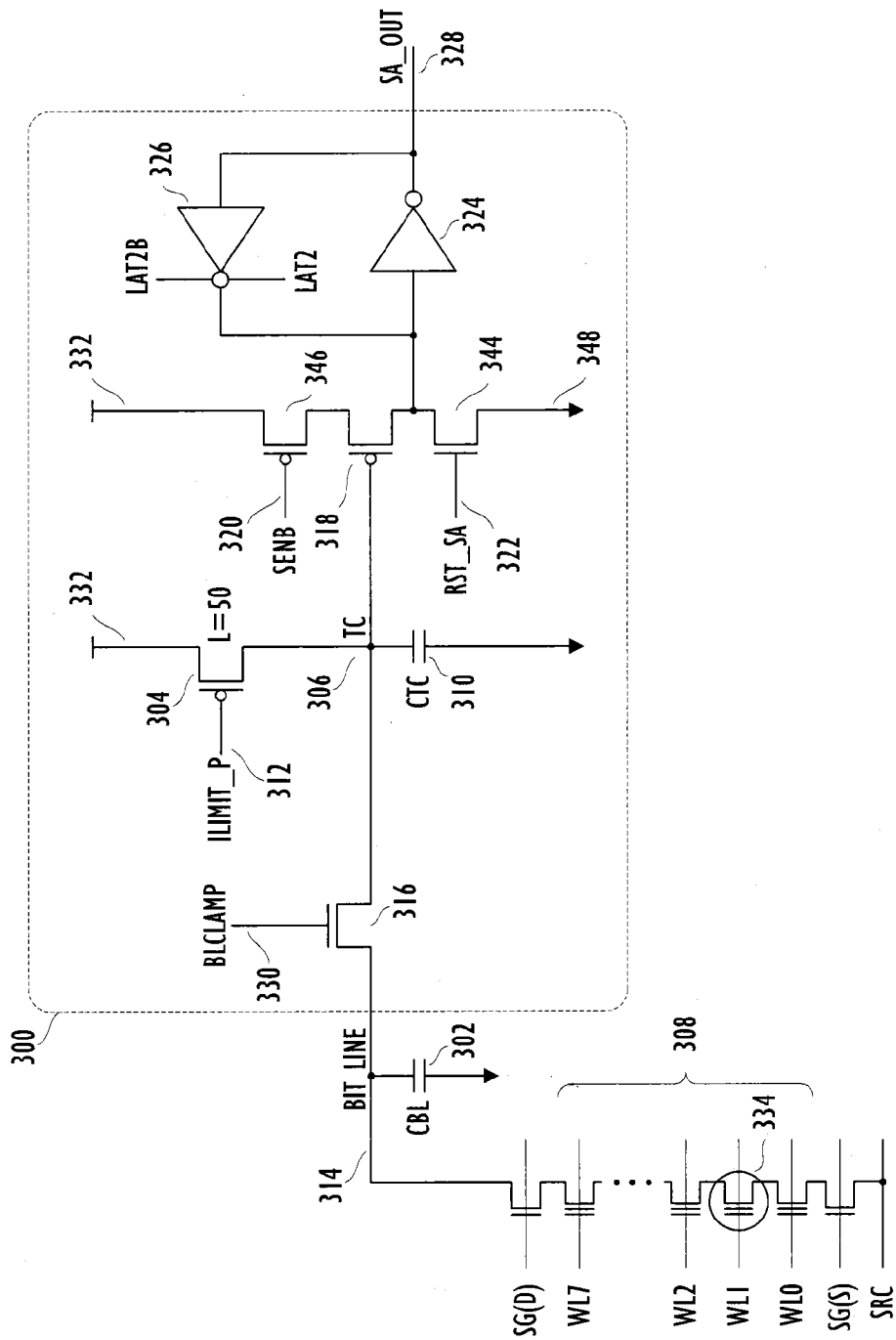
FIG. 3 illustrates a schematic diagram of a typical prior art sense amplifier circuit.

Sense amplifier circuits are typically utilized in memory devices to facilitate performing a sense (e.g., read and/or verify) operation on each of one or more selected (e.g., target) memory cells in the memory device. FIG. 3 illustrates a typical prior art sense amplifier circuit 300. The sense amplifier circuit 300 is shown coupled to a particular string of memory cells 308 by a particular bit line 314, such as shown by string 108 and bit lines 116 of FIG. 1, for example. Capacitor CBL 302 is representative of the characteristic capacitance of bit line 314 and memory cell string 308, for example. As part of the sense operation, the sense amplifier 300 injects a reference current into the TC node (e.g., sense node) 306 by activating a p-channel long body transistor 304 by driving the signal line ILIMIT_P 312 to a particular bias level. The long body transistor 304 is coupled to a voltage source 332 and to the TC node 306 and might have a length of 50 units, wherein a unit might comprise a minimum feature size of the memory device die, for example. The capacitor CTC 310 shown coupled to the TC node 306 is representative of the capacitance at the node 306 and additional circuitry coupled to it, such as the p-channel transistor 318, for example.

Additional transistors of the sense amplifier circuitry facilitate sensing of a potential on the TC node 306. For example, the control gate of transistor 318 is shown coupled to the TC node 306. Thus, transistor 318 is configured to be responsive to a potential present on the TC node 306. N-channel transistor 344 is shown coupled between the transistor 318 and a reference potential (e.g., ground) 348. Signal line RST_SA 322 coupled to transistor 344 serves to facilitate resetting the sense amplifier, such as following a completed sense operation, for example. Signal line SENB 320 coupled to p-channel transistor 346 facilitates isolating the transistor 318 from the voltage source 332, such as during a reset of the sense amplifier, for example. Inverters 324 and 326 provide a latching function of a potential sensed at the TC node 306 and generate an output signal SA_OUT of the sense amplifier. The SA_OUT signal line 328 might be coupled to additional control circuitry (not shown) of the memory device configured to respond to the sense amplifier as part of a sensing operation, for example. The output signal SA_OUT might comprise a signal representative of a logic level signal, such as a logic 'high' or logic 'low' level indicative of a sensed data state of the selected memory cell, for example.

During a precharge portion of a sense operation, the gate of the long body transistor 304 is biased by a potential imposed on signal line ILIMIT_P 312 to precharge the node 306 by injecting a precharge current into the TC node 306. An additional potential (e.g., $V_{BLCLAMP}$) is imposed on signal line BLCLAMP 330. Biasing the gate of transistor 316 pulls up the bit line 314 to a potential of $V_{BLCLAMP}$-Vth. Where Vth is the threshold voltage of transistor 316, for example. During the precharge phase, the current injected into node 306 might be −1 µA, for example.

Following the precharging of the TC node 306 and the bit line 314, a second portion of the sense operation is performed. During this portion of the sense operation, word lines coupled to unselected memory cells, such as WL0 and WL2-WL7 of string 308, might be biased with a Vpass potential. The Vpass potential activates the unselected memory cells coupled to these word lines to operate in a pass through mode regardless of their data state. The word line coupled to the selected memory cell, such as WL1 coupled to selected memory cell 334, might be biased with a particular sensing potential (e.g., sensing voltage) in order to determine a data state of the selected memory cell 334. If the threshold voltage of the selected memory cell 334 is above the particular applied sensing voltage, the selected memory cell 334 will not be activated and the bit line 314 will remain at the precharged $V_{BLCLAMP}$-Vth potential. If the threshold voltage of the selected memory cell 334 is below the applied particular sensing voltage, the selected memory cell will be activated and the bit line 314 will be discharged, for example. This will also discharge (e.g., pull-down) the potential of the TC node 306. Thus, the sense amplifier circuitry 300 detects whether or not the pre-charged bit line 314 and TC node 306 is discharged during the sense operation to determine the data state of the selected memory cell 334.

Figure 4:
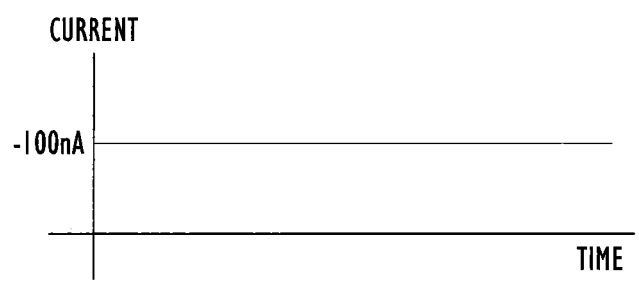
FIG. 4 illustrates a plot corresponding to an operating condition of the typical sense amplifier circuit shown illustrated in FIG. 3.

However, leakage currents might occur during the sense operation of the selected memory cell 334 which might result in enough of a discharge of the bit line 314 to result in the sense amplifier erroneously responding to what it believes to be a particular data state of the selected memory cell. Thus, read and/or verify errors might occur as a result of these leakage currents discharging the sensed bit line 314 and TC node 306 of the sense amplifier. For example, some residual current due to depletion, leakage, insufficient programming or other phenomena might occur during the sense operation. The reference current injected into the TC node 306 by the long body transistor 304 during the sense operation is intended to compensate for these potential leakage currents and prevent the unintended discharge of the bit line 314 and/or the TC node 306. However, the injected current should be low enough that a selected memory cell that is activated by the applied sensing voltage is able to sink enough current to discharge the bit line 314 and to overcome the potential maintained at the TC node 306 by the injected reference current to indicate its actual data state. The current injected into the TC node TC might be −100 nA during the sensing of the selected memory cell 334, for example. FIG. 4 illustrates a plot of the reference current injected into the TC node 306 by the long body transistor 304 during sensing of the selected memory cell 334, for example.

The sense amplifier 300 is typically configured to have a threshold point (e.g., sense threshold level) close to the precharge potential that is established on the TC node 306 prior to sensing the selected memory cell. The threshold point might be a particular potential on the TC node wherein the sense amplifier outputs a first logic level indicative of a first data state of a sensed selected memory cell when the potential of the TC node is equal to or above the threshold point. The sense amplifier might output a second logic level indicative of a second data state of the sensed selected memory cell when the potential of the TC node is below the threshold point, for example. Choosing a threshold point close to the precharge potential improves the speed of the sense device by reducing the time necessary to detect the data state of the selected memory cell 334. Choosing a threshold point close to the precharge potential further improves power consumption of the sense device by reducing the amount of current necessary to precharge the TC node 306 for each sensing operation. However, selecting a threshold point close to the precharge potential potentially risks erroneous indications of the data state of a selected memory cell if undesired, leakage currents such as described above occur during the sense operation.

As discussed above, memory devices typically utilize large numbers of sense amplifiers operating in parallel. Further, each long body transistor utilized in the sense amplifiers might have slightly different operating characteristics, such as having some variation in the threshold voltages of each long body transistor, for example.

Figure 5:
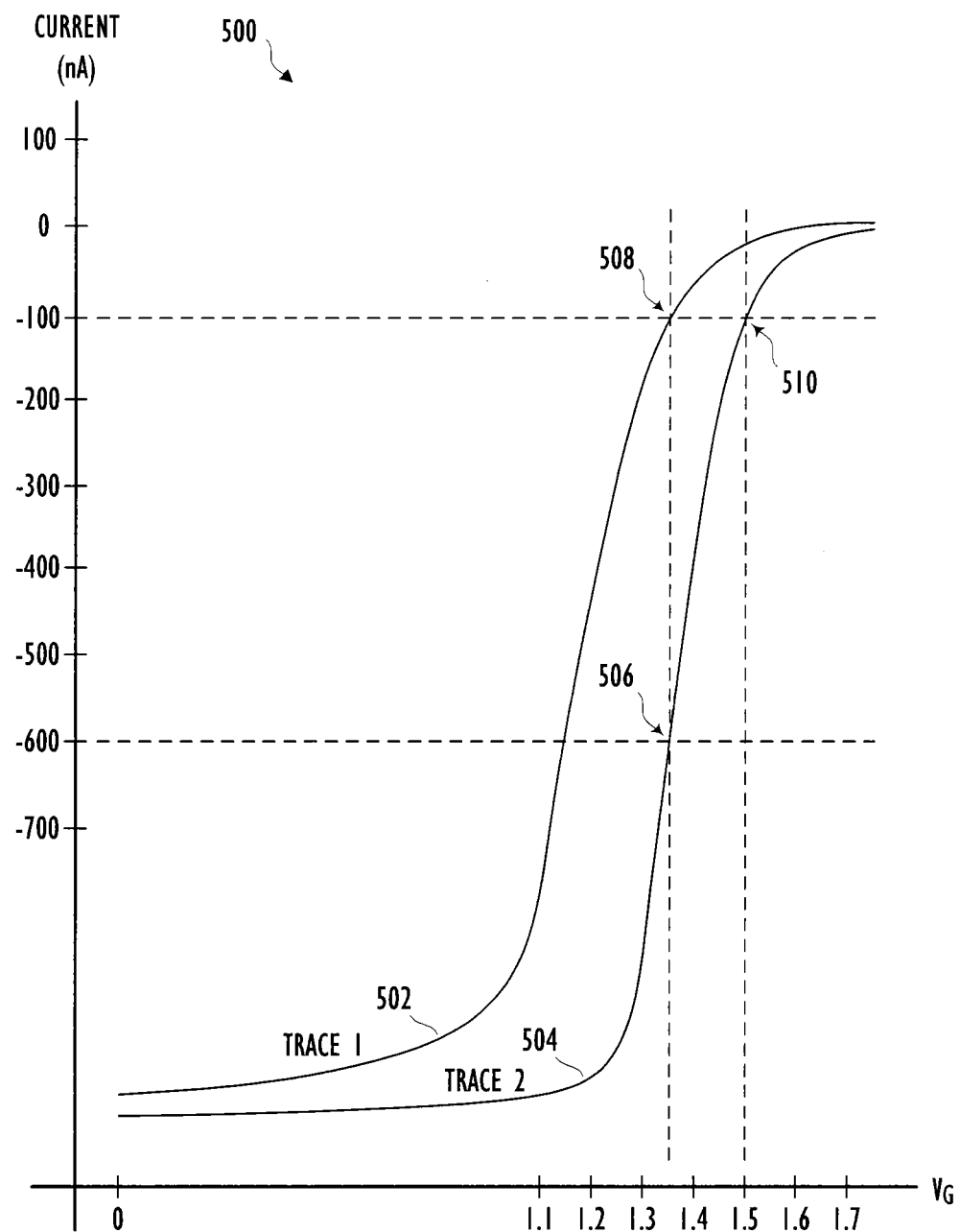
FIG. 5 illustrates a plot of drain current versus gate voltage for two different transistors.

FIG. 5 illustrates a plot 500 of drain current (ID) vs. gate voltage (Vg) for two transistors of differing lengths. Trace 1 502 is representative of the ID vs. Vg response for a long body transistor, such as transistor 304 shown in FIG. 1, for example. Trace 2 504 is representative of a ID vs. Vg response for a short body transistor (relative to the long body transistor represented by Trace 1 502). The long body transistor represented by Trace 1 might have a 5-to-1 length ratio compared with the short body transistor represented by Trace 2, for example.

It is typically desirable to ensure that a sufficient operating margin exists to accommodate variations in threshold voltages of the population of long body transistors supplying the current injected into the TC node 306. This might be illustrated by way of example. The desired reference current (e.g., target current) to be injected into the TC node 306 of FIG. 3 might be determined to be −100 nA, for example. The typical threshold voltage for the population of long body transistors might be 0.8V and a source voltage Vs utilized might be 2.4V. Utilizing a long body transistor 304, and referring to Trace 1 502 of FIG. 5, it can be seen that at a current of −100 nA might be achieved by a Vg of 1.35V, as noted by the intersection of the two dashed lines at point 508 of the Figure, for example.

With regard to the short body transistor, it can be seen from FIG. 5 that a control gate voltage Vg of 1.5V is needed to achieve the desired −100 nA current, as noted by the intersection of the two dashed lines at point 510 of FIG. 5, for example.

TABLE 1

| Device | |VGS| = Vs − Vg | |VGS| − Vth |
|---|---|---|
| Long Body Transistor | 2.4 V − 1.35 V = 1.05 V | 1.05 V − 0.8 V = 0.25 V |
| Short Body Transistor | 2.4 V − 1.5 V = 0.9 V | 0.9 V − 0.8 V = 0.1 V |

Table 1 illustrates multiple calculations performed using data taken from FIG. 5 and the example conditions noted above. It can be seen in Table 1 that the difference between the calculated |VGS| and the threshold voltage 0.8V is larger for the long body transistor than for the short body transistor. Thus, the long body transistor might be considered to be a more robust device with respect to threshold voltage mismatch between each of the long body transistors than a mismatch of threshold voltages between short body transistors.

As discussed above, long body transistors, such as transistor 304 shown in FIG. 3, are used to generate low level and precise reference currents in memory device sense amplifier circuitry. However, these long body transistors consume a relatively large area of the memory device. It might be desirable to utilize a short body transistors in sense circuitry to reduce the area occupied by these circuits yet maintain the level of device robustness associated with long body transistors. Thus, one or more embodiments according to the present disclosure facilitate utilization of short body transistors which consume less area while still providing low level and precise reference currents.

Figure 6:
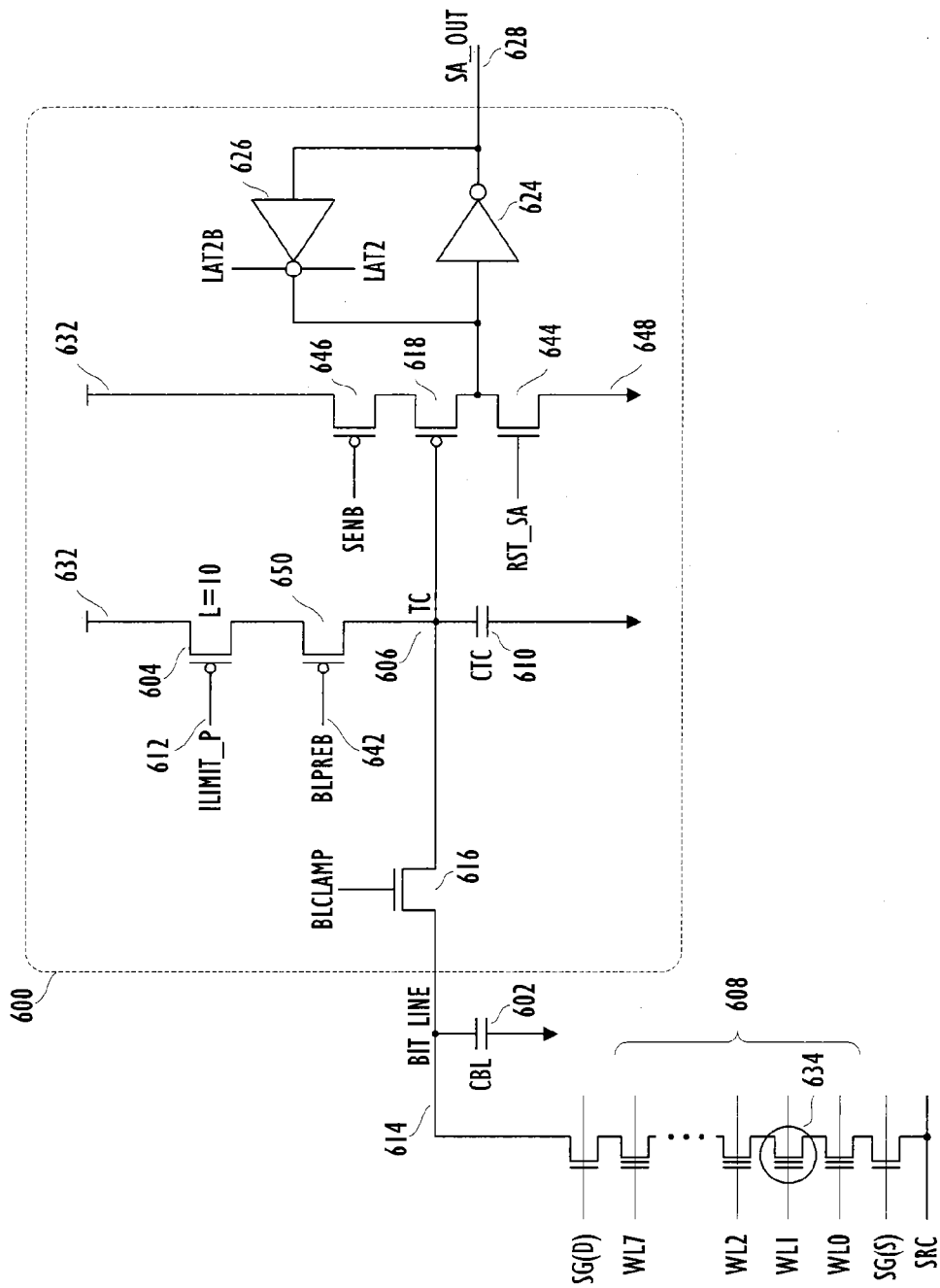
FIG. 6 illustrates a schematic diagram of sense amplifier circuitry according to an embodiment of the present disclosure.

FIG. 6 illustrates a schematic of a sense amplifier 600 according to one or more embodiments of the present disclosure which is coupled to a string of memory cells 608 by the gate 616 and a bit line 614. The string of memory cells 608 might comprise a selected memory cell 634 for a sense operation, for example. Capacitor CBL 602 is shown to be representative of the characteristic bit line and memory cell string 608 capacitance.

According to various embodiments of the present disclosure, transistor 604 comprises a short body p-channel transistor whose operating characteristics is represented by Trace 2 of FIG. 5, for example. Transistor 604 is shown coupled to a voltage source 632. The short body transistor 604 might have a length of 10 units which is in contrast with the long body transistor 304 shown in FIG. 3 having a length of 50 units, for example. Again referring to FIG. 6, the sense amplifier 600 according to various embodiments further comprises an additional p-channel transistor 650 coupled between transistor 604 and the TC node 606. Transistor 650 might be activated and deactivated by driving the BLPREB signal line 642 to one of a number of bias potentials and at a particular frequency and/or duty cycle according to various embodiments of the present disclosure. The capacitor CTC 610 shown coupled to the TC node 606 is representative of the capacitance at the TC node 606 and additional circuitry coupled to it, such as the p-channel transistor 618, for example.

FIG. 6 further illustrates that transistor 618 is configured to be responsive to a potential present on the TC node (e.g., sense node) 606. N-channel transistor 644 is shown coupled between the transistor 618 and a reference potential (e.g., ground) 648. Signal line RST_SA coupled to transistor 644 serves to facilitate resetting the sense amplifier, such as following a completed sense operation, for example. Signal line SENB coupled to p-channel transistor 646 facilitates isolating the transistor 618 from the voltage source 632, such as during a reset of the sense amplifier, for example. Inverters 624 and 626 provide a latching function of a potential sensed at the TC node 606 and generate an output signal SA_OUT of the sense amplifier. The SA_OUT signal line 628 might be coupled to additional control circuitry (not shown) of the memory device configured to respond to the sense amplifier as part of a sensing operation, for example. The output signal SA_OUT might comprise a signal representative of a logic level signal, such as a logic 'high' or logic 'low' level indicative of a sensed data state of the selected memory cell, for example.

By way of example, the desired current to inject into the TC node 606 during a sense operation might be −100 nA and the desired threshold voltage margin (e.g., Vgs-Vth) might be 0.25 V. By reference to FIG. 5, it is shown by Trace 2 (e.g., representing a short body transistor such as transistor 604) that the current in the short body transistor 604 might be −600 nA at a VG of 1.35V, as indicated by the point 506, for example. Thus, to obtain substantially similar threshold voltage margin (e.g., 0.25V) using short body transistors as with utilizing long body transistors discussed above, the current in the short body device will be substantially equal to −600 nA and not the desired current of −100 nA.

Various embodiments according to the present disclosure facilitate activating and deactivating transistor 650 to provide an effective injected current of −100 nA into the TC node 606 while still maintaining the threshold voltage margin of 0.25V, for example. It should be noted that the various embodiments of the present disclosure are not limited to a threshold voltage margin of 0.25V and a desired injection current of −100 nA. These values are provided by way of example to facilitate a better understanding of one or more embodiments of the present disclosure.

Figure 7A:
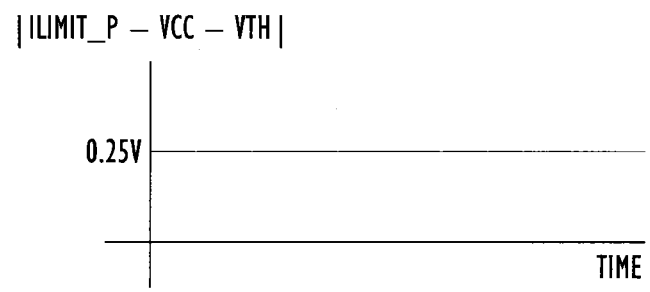
FIGS. 7A-7C illustrate graphical plots of operating conditions of sense amplifier circuitry according to an embodiment of the present disclosure.
Figure 7B:
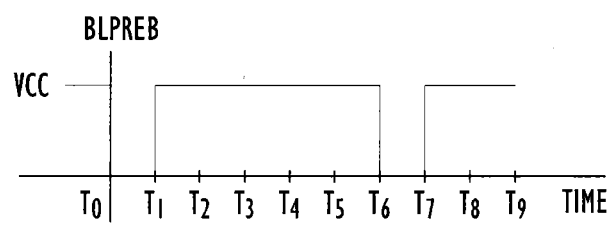
Figure 7C:
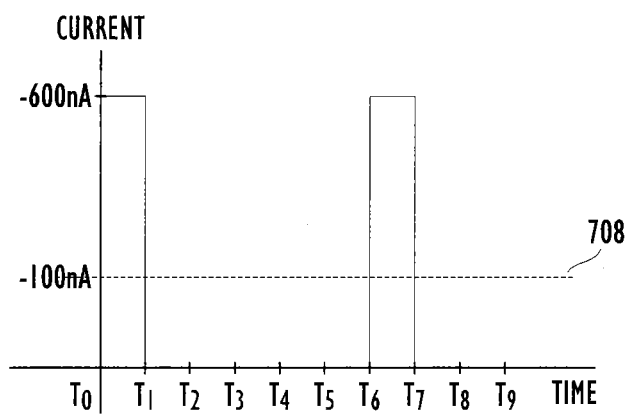

FIGS. 7A-7C illustrate a number of plots according to various embodiments of the present disclosure. FIG. 7A illustrates the particular desired threshold voltage margin of 0.25V for a population of short body transistors such as transistor 604, for example. FIG. 7B illustrates a signal provided on signal line BLPREB 642 which activates and deactivates transistor 650 over particular time periods according to various embodiments of the present disclosure. FIG. 7C illustrates current flow within the short body transistor 604 when operated as described above with respect to FIG. 6 and in compliance with the Trace 2 504 plot shown in FIG. 5, for example. Thus, by adjusting the frequency and/or duty cycle of the BLPREB signal, the effective current injected into the TC node 606 might be adjusted. For example, FIGS. 7B and 7C show that an effective (e.g., average) current of −100 nA, as indicated by the dashed line 708, might be injected into the TC node 606 by activating transistor 650 for ⅙ of a particular time period (e.g., T0-T6) and deactivating the transistor 650 for the remainder (e.g., T1-T6) of the particular time period. According to one or more embodiments, the frequency and/or duty cycle of the BLPREB signal 642 might be adjusted to achieve different effective current levels injected into the TC node 606. For example, the BLPREB signal 642 might be adjusted to a 25% duty cycle (not shown) to obtain an average injected current of −150 nA at the same threshold voltage margin of 0.25V, for example. Still further, according to one or more embodiments, the frequency and/or duty cycle of the BLPREB signal might be tailored responsive to sense amplifier device characteristics such as the CBL capacitance 602 and/or CTC capacitance 610 shown in FIG. 6. The frequency and/or duty cycle of the activation and deactivation of transistor 650 might also be adjusted responsive to current leakage determined to exist within the sense circuitry, for example.

Figure 8:
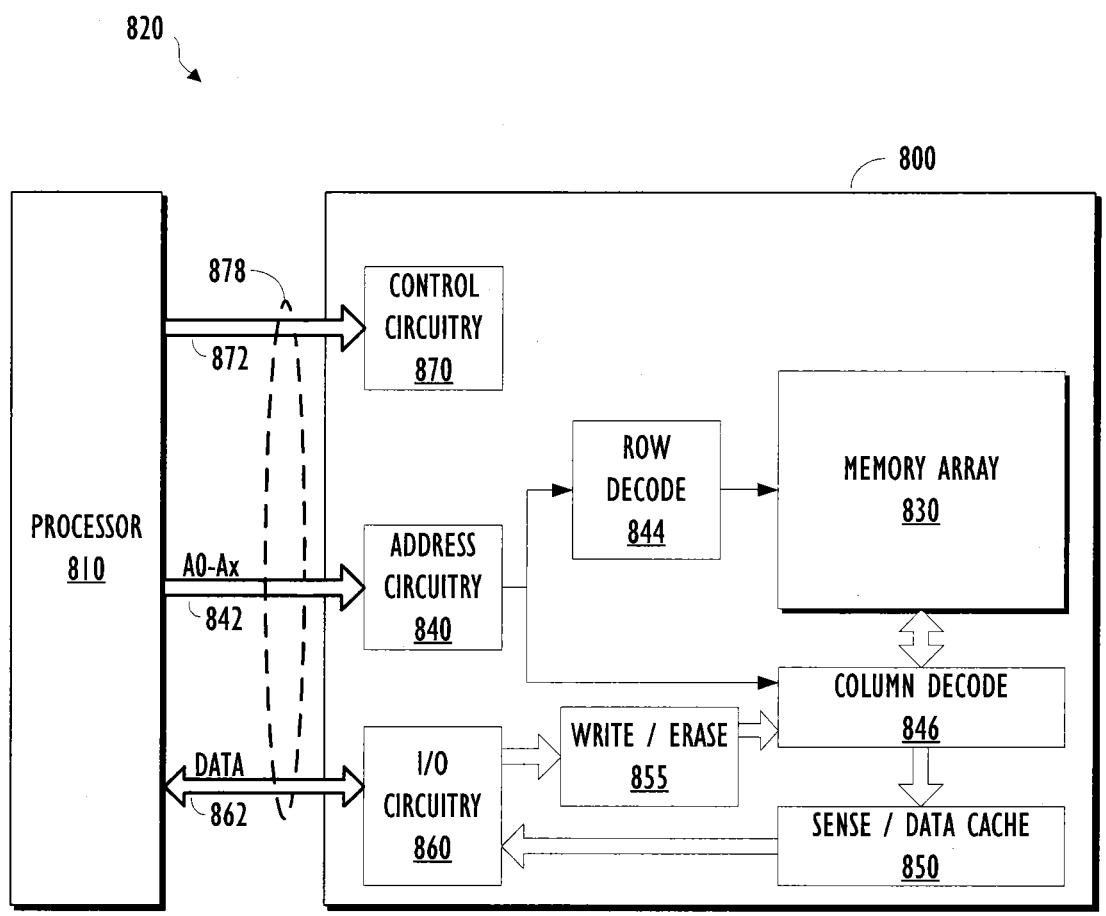
FIG. 8 illustrates a functional block diagram of an electronic system according to an embodiment of the present disclosure.

FIG. 8 is a functional block diagram of an electronic system having at least one memory device 800 according to one or more embodiments of the present disclosure. The memory device 800 illustrated in FIG. 8 is coupled to a host such as a processor 810. The processor 810 may be a microprocessor or some other type of controlling circuitry. The memory device 800 and the processor 810 form part of an electronic system 820. The memory device 800 has been simplified to focus on features of the memory device that are helpful in understanding various embodiments of the present disclosure.

The memory device 800 includes one or more arrays of memory cells 830 that can be arranged in banks of rows and columns. Memory array 830 might comprise SLC and/or MLC memory, for example. According to one or more embodiments, these memory cells of memory array 830 are flash memory cells. The memory array 830 might consist of multiple banks, blocks and segments of memory cells residing on a single or multiple die as part of the memory device 800. The memory array 830 might also be adaptable to store varying densities (e.g., MLC(four level) and MLC(eight level)) of data in each cell.

An address buffer circuit 840 is provided to latch address signals provided on address input connections A0-Ax 842. Address signals are received and decoded by a row decoder 844 and a column decoder 846 to access the memory array 830. It will be appreciated by those skilled in the art, with the benefit of the present description, that the number of address input connections 842 might depend on the density and architecture of the memory array 830. That is, the number of addresses increases with both increased memory cell counts and increased bank and block counts.

The memory device 800 reads data in the memory array 830 by sensing voltage or current changes in the memory array columns using sense devices, such as sense/data cache circuitry 850 including sense amplifier circuitry 600 discussed above with respect to FIG. 6, for example. The sense/data cache circuitry 850, in at least one embodiment, is coupled to read and latch a row of data from the memory array 830. Data input and output buffer circuitry 860 is included for bi-directional data communication over a plurality of data connections 862 with the processor 810. Write circuitry 855 is provided to write data to the memory array 830.

Control circuitry 870 is configured at least in part to implement the methods of various embodiments of the present disclosure, such as generating various reference currents in the sense devices during a sensing operation, for example. Control circuitry 870 might further be configured to determine the frequency and/or duty cycle of signals to activate and deactivate the transistor 650 such as discussed above with respect to FIG. 6, for example. In at least one embodiment, the control circuitry 870 may utilize a state machine. Control signals and commands can be sent by the processor 810 to the memory device 800 over the command bus 872. The command bus 872 may be a discrete signal or may be comprised of multiple signals, for example. These command signals 872 are used to control the operations on the memory array 830, including data read, data write (program), and erase operations. The command bus 872, address bus 842 and data bus 862 may all be combined or may be combined in part to form a number of standard interfaces 878. For example, the interface 878 between the memory device 800 and the processor 810 may be a Universal Serial Bus (USB) interface. The interface 878 may also be a standard interface used with many hard disk drives (HDD) as are known to those skilled in the art. For example, the interface might take the form of an SATA or PATA interface.

The electronic system 820 illustrated in FIG. 8 has been simplified to facilitate a basic understanding of the features of the memory and is for purposes of illustration only. A more detailed understanding of internal circuitry and functions of non-volatile memories are known to those skilled in the art.

CONCLUSION

Various embodiments of the present disclosure facilitate a reduction in area consumed by sense amplifier circuitry included in memory devices. For example, short body transistors combined with a gate to cycle a reference current on and off yields an effective current substantially similar to reference currents supplied by long body transistors. This facilitates an increase in available area for additional memory in a memory device while maintaining precise and low level reference currents utilized in sensing operations within the memory device.

Although specific embodiments have been illustrated and described herein, it will be appreciated by those of ordinary skill in the art that any arrangement that is calculated to achieve the same purpose may be substituted for the specific embodiments shown. Many adaptations of the disclosure will be apparent to those of ordinary skill in the art. Accordingly, this application is intended to cover any adaptations or variations of the disclosure.

What is claimed is:

1. A method of operating a memory device, the method comprising:
   activating a first transistor coupled to a voltage source;
   activating and deactivating a second transistor coupled between the first transistor and a particular node where the particular node is coupled to a string of memory cells by a third transistor;
   activating the third transistor; and
   biasing a control gate of a selected memory cell of the string of memory cells with a particular sensing voltage;
   wherein the particular node is further coupled to sense circuitry configured to determine a potential of the particular node while the control gate of the selected memory cell is biased to the particular sensing voltage; and
   wherein the second transistor is activated and deactivated at least once while the first transistor is activated.

2. The method of claim 1, wherein biasing the control gate of the selected memory cell with the particular sensing voltage further comprises biasing the control gate of the selected memory cell with one of a read voltage or a program verify voltage.

3. The method of claim 1, wherein activating and deactivating the second transistor further comprises activating and deactivating the second transistor at least once while biasing the control gate of the selected memory cell with the particular sensing voltage.

4. The method of claim 1, wherein activating and deactivating the second transistor further comprises activating and deactivating the second transistor which injects an average current over a particular time period into the particular node which is less than a current injected through the first and the second transistor when the first and the second transistors are activated, wherein the second transistor is deactivated for at least a portion of the particular time period.

5. The method of claim 4, wherein the average current over time comprises a current which is equal to or greater than a leakage current from the particular node and is less than a current through the selected memory cell operating in an activated state.

6. The method of claim 1, wherein activating and deactivating the second transistor further comprises activating and deactivating the second transistor at a particular frequency.

7. The method of claim 6, wherein activating and deactivating the second transistor further comprises adjusting a duty cycle of activating and deactivating the second transistor at the particular frequency.

8. A method of generating a reference current in a memory device, the method comprising:
activating a first transistor coupled to a voltage source;
activating and deactivating a second transistor coupled between the first transistor and a node while the first transistor is activated, wherein the second transistor is activated and deactivated at a particular rate thereby injecting a current into the particular node when the first and the second transistors are activated; and
applying a particular sensing voltage to a selected memory cell of a string of memory cells coupled to the particular node;
wherein the particular node is further coupled to a sense device configured to output a signal responsive to a potential of the particular node while the selected memory cell is biased with the particular sensing voltage.

9. The method of claim 8, wherein activating and deactivating the second transistor further comprises activating and deactivating the second transistor where a current sourced through the first and the second transistors over a particular period of time comprises an average current injected into the particular node over the particular period of time, where the average current is less than the current injected when the first and the second transistors are activated at the same time, wherein the second transistor is deactivated for at least a portion of the particular period of time.

10. A method of determining a data state of a memory cell coupled to sense circuitry in a memory device, the method comprising:
activating a first transistor coupled to a voltage source;
activating and deactivating a second transistor coupled between the first transistor and a particular node while the first transistor is activated, wherein the second transistor is activated and deactivated at a particular rate thereby injecting a reference current into the particular node when the first and the second transistors are activated;
applying a sensing voltage to a selected memory cell of the string of memory cells to determine a data state of the selected memory cell;
wherein the sensing voltage is applied while the reference current is injected into the particular node; and
wherein the reference current comprises a switched current having an effective current value over a particular time period which is less than a maximum current value injected into the particular node over the particular time period.

11. The method of claim 10, further comprising:
generating a sense circuitry output signal indicative of a first data state of the selected memory cell when a potential of the particular node remains above a particular threshold potential while applying the sensing voltage; and
generating a sense circuitry output signal indicative of a second data state of the selected memory cell when a potential of the particular node falls below the particular threshold potential while applying the sensing voltage.

12. A sense circuit, comprising:
a voltage source;
an output node;
an input node;
a first transistor coupled to the voltage source and having a control gate coupled to a first control signal line;
a second transistor coupled between the first transistor and a sense node and having a control gate coupled to a second control signal line;
sensing circuitry coupled to the sense node and configured to output a logic level signal at the output node responsive to a potential of the sense node; and
control circuitry, wherein the control circuitry is configured to drive the first control signal line to activate the first transistor and to drive the second control signal line with a time varying signal to activate and deactivate the second transistor while the first transistor is activated.

13. The sense circuit of claim 12, wherein the time varying signal comprises a signal having two logic levels which changes at a particular frequency.

14. The sense circuit of claim 13, wherein the time varying signal comprises a signal having a particular duty cycle.

15. The sense circuit of claim 12, wherein the first and the second transistors comprise p-channel field effect transistors.

16. The sense circuit of claim 12, wherein a particular current is injected into the sense node while the first transistor and the second transistor are in an activated state.

17. The sense circuit of claim 12, wherein the sensing circuitry is further configured to exhibit a particular sense threshold level.

18. The sense circuit of claim 17, wherein the sensing circuitry is further configured to:
generate a first logic level output signal when a potential of the sense node is equal to or greater than the particular sense threshold level; and
generate a second logic level output signal when the potential of the sense node is less than the particular sense threshold level.

19. The sense circuit of claim 12, further comprising a third transistor coupled between the input node and the sense node and having a control gate coupled to a third control signal line.

20. The sense circuit of claim 19, wherein the control circuitry is further configured to drive the third control signal line to activate the third transistor.

21. The sense circuit of claim 19, wherein the third transistor comprises an n-channel field effect transistor.

22. The sense circuit of claim 12, wherein the sensing circuitry comprises:
a fourth transistor coupled between a reference source and a first node and having a control gate coupled to a fourth control signal line;
a fifth transistor coupled to the voltage source and having a control gate coupled to a fifth control signal line;
a sixth transistor coupled between the first node and the fifth transistor and having a control gate coupled to the sense node; and
a first inverter having an input coupled to the first node and an output coupled to the output node;
wherein the control circuitry is further configured to drive the fourth control signal line to activate the fourth transistor to perform a reset operation, and to drive the fifth control signal line to activate and deactivate the fifth transistor.

23. The sense circuit of claim 22, wherein the sensing circuitry further comprises:

a second inverter having an output coupled to the first node and an input coupled to the output node.

24. The sense circuit of claim 22, wherein the reference source comprises a ground potential reference source.

25. The sense circuit of claim 22, wherein the fourth transistor comprises an n-channel field effect transistor, and the fifth and sixth transistors comprise p-channel field effect transistors.

26. A memory device, comprising:
a string of serially coupled memory cells;
a first transistor coupled to a voltage source;
a second transistor coupled between the first transistor and a particular node, where the particular node is coupled to a first end of the string of memory cells;
sense circuitry coupled to the particular node, wherein the sense circuitry is configured to output a signal responsive to a potential of the particular node; and
control circuitry, wherein the control circuitry is configured to activate the first transistor and to activate and deactivate the second transistor while the first transistor is activated to maintain a particular reference current into the particular node; and
wherein the control circuitry is further configured to apply a particular sense voltage to a control gate of a selected memory cell of the string of memory cells while the particular reference current into the particular node is maintained.

27. The memory device of claim 26, wherein the particular sense voltage comprises one of a read voltage or a program verify voltage.

28. The memory device of claim 26, further comprising a third transistor coupled between the particular node and the first end of the string of memory cells.

29. The memory device of claim 26, wherein the particular reference current comprises an average current over a particular time period.

30. The memory device of claim 26, wherein the control circuitry is further configured to activate and deactivate the second transistor at a particular frequency.

31. The memory device of claim 30, wherein the control circuitry is further configured to adjust the frequency responsive to a particular current leakage characteristic of the particular node.

32. The memory device of claim 30, wherein the control circuitry is further configured to activate and deactivate the second transistor at the particular frequency having a particular duty cycle.

33. The memory device of claim 32, wherein the control circuitry is further configured to adjust the duty cycle responsive to a particular current leakage characteristic of the particular node.

34. A memory device, comprising:
a string of memory cells coupled source to drain between a data line and a source line; and
a sense circuit, wherein the sense circuit comprises:
a voltage source;
an output node;
an input node coupled to the data line;
a first transistor coupled between the input node and a sense node and having a control gate coupled to a first control signal line;
a second transistor coupled to the voltage source and having a control gate coupled to a second control signal line;
a third transistor coupled between the second transistor and the sense node and having a control gate coupled to a third control signal line;
sensing circuitry coupled to the sense node and configured to output a logic level signal at the output node responsive to a potential of the sense node; and
control circuitry, wherein the control circuitry is configured to drive the first control signal line to activate the first transistor, drive the second control signal line to activate the second transistor, and to drive the third control signal line with a time varying signal to activate and deactivate the third transistor while the second transistor is activated;
wherein the control circuitry is further configured to bias a selected memory cell of the string of memory cells with a particular sensing voltage and to activate remaining memory cells of the string of memory cells to operate in a pass through mode.

35. The memory device of claim 34, wherein the particular sensing voltage comprises one of a read voltage or a program verify voltage.

* * * * *